(12) United States Patent
Fermon et al.

(10) Patent No.: US 7,944,205 B2
(45) Date of Patent: May 17, 2011

(54) SYSTEM FOR MEASURING A MAGNETIC RESONANCE SIGNAL BASED ON A HYBRID SUPERCONDUCTIVE-MAGNETORESISTIVE SENSOR

(75) Inventors: Claude Fermon, Orsay (FR); Jacques Jacquinot, Paris (FR); Myriam Pannetier-Lecoeur, Bures sur Yvette (FR); Joseph Scola, Paris (FR)

(73) Assignee: Commissariat a l'Energie Atomique et Aux Energies Alternatives, Paris (FR)

( * ) Notice: Subject to any disclaimer, the term of this patent is extended or adjusted under 35 U.S.C. 154(b) by 184 days.

(21) Appl. No.: 12/305,486

(22) PCT Filed: Jun. 22, 2007

(86) PCT No.: PCT/FR2007/051502
§ 371 (c)(1),
(2), (4) Date: May 12, 2009

(87) PCT Pub. No.: WO2007/148029
PCT Pub. Date: Dec. 27, 2007

(65) Prior Publication Data
US 2009/0302843 A1     Dec. 10, 2009

(30) Foreign Application Priority Data

Jun. 22, 2006 (FR) .................... 06 52599

(51) Int. Cl.
*G01V 3/00* (2006.01)
(52) U.S. Cl. .................... 324/306; 324/309
(58) Field of Classification Search .......... 324/300–322; 600/407–445
See application file for complete search history.

(56) References Cited

U.S. PATENT DOCUMENTS

| 4,875,010 | A | | 10/1989 | Yokosawa et al. |
| 5,492,720 | A | * | 2/1996 | Gill et al. ............ 427/131 |
| 5,825,179 | A | * | 10/1998 | Sherman et al. ....... 324/210 |
| 7,378,865 | B2 | * | 5/2008 | Taguchi et al. ........ 326/4 |

(Continued)

FOREIGN PATENT DOCUMENTS

WO    WO 2004/068152    8/2004

OTHER PUBLICATIONS

Pannetier, Myriam et al., "Femtotesla Magnetic Field Measurement with Magnetoresistive Sensors," Science American Assoc. Adv. Sci USA, vol. 304, No. 5677, pp. 1648-1650, Jun. 11, 2004.

(Continued)

*Primary Examiner* — Brij B Shrivastav
(74) *Attorney, Agent, or Firm* — Weingarten, Schurgin, Gagnebin & Lebovici LLP

(57) ABSTRACT

The system for measuring a magnetic resonance signal within a sample (4) placed in a static external magnetic field (H) includes an excitation device (1 to 3, 6 to 10) for applying high-intensity radio-frequency pulses at a predetermined emission frequency $f_e$ in a measurement zone containing the sample (4). The excitation device includes an excitation coil (3) tuned to the predetermined emission frequency $f_e$ and disposed in the vicinity of the sample (4) in such a way as to produce an electromagnetic field essentially perpendicular to the static external magnetic field (H). The system further includes at least a superconductive-magnetoresistive hybrid sensor (5) including a superconductive loop having a constriction adapted to increase significantly the current density and at least a magnetoresistive sensor placed in the immediate vicinity of said constriction (72) and being separated therefrom by an insulative deposit.

27 Claims, 6 Drawing Sheets

U.S. PATENT DOCUMENTS 7,385,400 B2 * 6/2008 Moore .................... 324/338
2010/0137705 A1 * 6/2010 Jensen et al. ............ 600/424

OTHER PUBLICATIONS

Blümich, B. et al., "The NMR-Mouse: Construction, Excitation, and Applications," Magnetic Resonance Imaging, vol. 16, No. 5/6, pp. 479-484, Jun. 1998.

Wurm, Martin et al., "Longitudinal detection of pulsed low-frequency, low-temperature nuclear magnetic resonance using a dc SQUID," Review of Scientific Instruments, vol. 69, No. 3, pp. 1456-1462, Mar. 1998.

Greenberg, Ya. S., "Application of superconducting quantum interference devices to nuclear magnetic resonance," Reviews of Modern Physics, The American Physical Society, vol. 70, No. 1, pp. 175-222, Jan. 1998.

Pannetier, M. et al., "Ultra-sensitive mixed sensors—Design and performance," Sensors and Actuators A, vol. 129, No. 1-2, pp. 247-250, Elsevier Sequoia S.A., Lausanne, CH, May 24, 2006.

* cited by examiner

SYSTEM FOR MEASURING A MAGNETIC RESONANCE SIGNAL BASED ON A HYBRID SUPERCONDUCTIVE-MAGNETORESISTIVE SENSOR

The present invention relates to a method and a system for measuring a magnetic resonance signal.

Nuclear magnetic resonance (NMR) is widely used in physics, chemistry, and biology to characterize materials and molecules by the response of their nuclei to radio-frequency magnetic excitation. More recently, magnetic resonance imaging (MRI) techniques based on this principle have been developed and now are commonly used in the medical field.

Until now, NMR has always used one or two coils tuned to the resonant frequency of the nuclei to be detected.

Predefined sequences of radio-frequency pulses are directed at the sample or the patient and a signal corresponding to the response of the nuclei under observation is detected in the same coil or in a second coil at 90° to the first. The operating frequency is determined by an external magnetic field multiplied by a gyromagnetic factor that is characteristic of each atom.

The sensitivity limit of an NMR spectrometer is determined by thermal noise associated with the resonant coil and the noise level of the associated preamplifier. For this reason, a number of researchers have proposed the use of cooled coils to reduce the thermal noise associated with the coil.

An intrinsic limitation of detection by means of a resonant coil is that the voltage measured at the terminals of the tuned circuit decreases with the frequency to be detected. The sensitivity of a resonant coil is therefore low with a weak field and therefore a low frequency.

Researchers have proposed using sensors based on superconducting quantum interference devices (SQUID), which have excellent sensitivity at low frequencies for detecting the NMR signal. However, SQUIDs have the disadvantage of being highly sensitive to the application of intense radio-frequency pulses.

First versions of hybrid sensors were proposed in the patent documents WO 2004/068152 A1 and WO 2004/068158 A1 and in the paper by M. Pannetier et al., "Femto-tesla Magnetic Field Measurement with Magnetoresistive Sensors" published in Science, 11.06.2004, Vol. 304. The sensors described in the above documents include a superconductive loop associated with a magnetoresistive sensor. The sensitivity axis of a hybrid sensor is perpendicular to the superconductive loop.

The present invention aims to measure a magnetic resonance signal more conveniently and more effectively than with standard methods, with excellent sensitivity over a wide measurement range.

The invention achieves the above objectives by means of a system for measuring a magnetic resonance signal in a sample placed in a static external magnetic field, including an excitation device for applying high-intensity radio-frequency pulses at a predetermined emission frequency $f_e$ in a measurement zone containing the sample, the excitation device including an excitation coil tuned to said predetermined emission frequency $f_e$ and disposed in the vicinity of the sample to emit an electromagnetic field essentially perpendicular to the static external magnetic field;

the system being characterized in that it further includes at least a superconductive-magnetoresistive hybrid sensor including a superconductive loop having a constriction adapted to increase significantly the current density and at least a magnetoresistive sensor placed in the immediate vicinity of said constriction, separated therefrom by an insulative deposit, said magnetoresistive sensor and said constriction being covered with a layer of non-superconductive metal to serve as a heat sink and to provide protection against destruction by radio-frequency pulses.

In the remainder of the description, the term "sample" refers to any article or patient subjected to radio-frequency magnetic excitation.

In one particular embodiment, the superconductive-magnetoresistive hybrid sensor includes at least two magnetoresistive sensors in a Wheatstone half-bridge configuration.

Each pair of hybrid sensors in a Wheatstone half-bridge configuration is then advantageously also connected to an additional low-frequency preamplifier itself connected to a filter to enable a magnetic field measurement at low frequency to be effected at the same time as a magnetic resonance measurement by the same sensors.

The magnetoresistive sensors can be supplied with power by an AC supply or a DC supply In one particular embodiment each magnetoresistive sensor is supplied with power by an AC supply at a predetermined frequency $f_{cap}$ different from said predetermined emission frequency $f_e$.

The difference between the frequency $f_{cap}$ of the current supplied to the magnetoresistive sensor and the resonant frequency $f_r$ of the sample is then preferably constant.

In one particular embodiment that is suited to measurements in a weak magnetic field, the hybrid sensor is directly in the vicinity of the sample.

The sensitivity axis of the hybrid sensor is then preferably perpendicular to the field created by the excitation coil.

In another particular embodiment that is well suited to measurements in a strong magnetic field, the hybrid sensor is coupled to the sample by a flux transformer.

The flux transformer is preferably at least partially superconductive.

The flux transformer includes a secondary loop that surrounds the sample or is disposed in the immediate vicinity of the sample.

The flux transformer advantageously includes a secondary loop perpendicular to the excitation coil.

In a preferred embodiment the flux transformer includes a primary loop parallel to the superconductive loop of the hybrid sensor and has a size equivalent thereto.

When the flux transformer is at least partially superconductive, the primary loop and the superconductive loop of the hybrid sensor are placed in a cooled enclosure.

In a different embodiment the flux transformer includes a primary loop that consists of the superconductive loop of the hybrid sensor.

In a further embodiment the system for measuring a magnetic resonance signal includes a dual hybrid sensor configured as a gradiometer including first and second hybrid sensors with their respective sensitivity axes symmetrical relative to the excitation coil and perpendicular to the field created thereby, one of the first and second hybrid sensors being in the immediate vicinity of the sample.

In one particular embodiment the excitation device includes multichannel emission means for emitting high-intensity radio-frequency pulses at predetermined emission frequencies $f_{e1}$, $f_{e2}$, $f_{e3}$ toward the excitation coil that is of the multiple tuning type so that it can be tuned to any of said predetermined emission frequencies $f_{e1}$, $f_{e2}$, $f_{e3}$.

The sensitivity axis of the magnetoresistive sensor is preferably essentially perpendicular to the static external magnetic field.

In a further particular embodiment the sample is a surface facing permanent magnets for creating said static magnetic field in a particular volume, the excitation coil is parallel to said surface in the vicinity of said particular volume, and the hybrid sensor is in the vicinity of said excitation coil and parallel thereto, being separated therefrom by a wall and an insulative empty space.

In a preferred embodiment the excitation device includes a frequency synthesizer for emitting a radio-frequency signal at an emission frequency $f_e$, a sequencer for emitting pulses for chopping the radio-frequency signal, an emission module connected to the frequency synthesizer and to the sequencer to emit said high-intensity radio-frequency pulses at said predetermined emission frequency $f_e$, a protection circuit for applying said pulses to the excitation coil, a preamplifier for receiving the signal at the resonant frequency $f_r$ very close to the emission frequency $f_e$ captured by the hybrid sensor, a demodulator circuit for receiving both the pulses at the emission frequency $f_e$ from the sequencer and the frequency synthesizer and also the pulses received at the resonant frequency $f_r$ from the preamplifier, and an acquisition device for recovering an output signal at the frequency $f_e+f_r$ or $f_e-f_r$.

The system of the invention can include a plurality of hybrid sensors.

One particular embodiment of the system then includes a single excitation coil and each hybrid sensor recovers a wanted signal using an individual preamplifier.

According to the invention, each hybrid sensor can be further connected to an additional low-frequency preamplifier itself connected to a filter to enable a magnetic field measurement at low frequency to be effected at the same time as a magnetic resonance measurement by the same sensors.

In a different embodiment, the magnetoresistive sensors of the hybrid sensors are then supplied with power by a direct current supply and the filter is a low-pass filter.

In another embodiment, the magnetoresistive sensors of the hybrid sensors are supplied with power by an alternating current supply and the filter is a band-pass filter centered on the frequency of the alternating current.

The magnetoresistive sensors of the hybrid sensors are chosen from Hall-effect sensors, anisotropic magnetoresistance (AMR) sensors, giant magnetoresistance (GMR) sensors, tunnel magnetoresistance (TMR) sensors, and colossal magnetoresistance (CMR) sensors.

The invention also provides a method of measuring a magnetic resonance signal in a sample placed in a homogeneous static external magnetic field, wherein high-intensity radio-frequency pulses are applied at a predetermined emission frequency $f_e$ in a measurement zone containing the sample to an excitation coil tuned to said predetermined emission frequency $f_e$ and disposed in the vicinity of the sample so as to emit an electromagnetic field essentially perpendicular to the static external magnetic field;

the method being characterized in that a magnetic resonance signal is detected by a superconductive magnetoresistive hybrid sensor including a superconductive loop including a constriction and a magnetoresistive sensor in the immediate vicinity of said constriction and separated therefrom by an insulative layer, said magnetoresistive sensor and said constriction being covered by at least one layer of non-superconductive metal in order to serve as a heat sink and to provide protection against destruction by radio-frequency pulses.

Other features and advantages of the invention emerge from the following description with reference to the appended drawings of particular embodiments of the invention, selected by way of example, in which drawings.

Magnetic resonance includes nuclear magnetic resonance, nuclear quadripolar resonance, electronic paramagnetic resonance, and ferromagnetic resonance (this list is not exhaustive). The remainder of the description of the invention refers to nuclear magnetic resonance, which is the most widespread application. The changes required for other types of resonance are minor.

During a nuclear magnetic resonance (NMR) experiment, high-intensity radio-frequency pulses are directed onto a sample placed in an external magnetic field, which can be the terrestrial magnetic field or a homogeneous magnetic field created by a coil or permanent magnets. These pulses turn the magnetization of the observed nuclear spins, which then precesses at a frequency given by the product of the magnetic field and the gyromagnetic ratio characteristic of each nucleus (42 megahertz per tesla (MHz/T) for the hydrogen atom). The radio-frequency pulses generate fields of the order of a few milliteslas, which corresponds to powers as high as several kilowatts for time periods of up to one millisecond.

Figure 1:
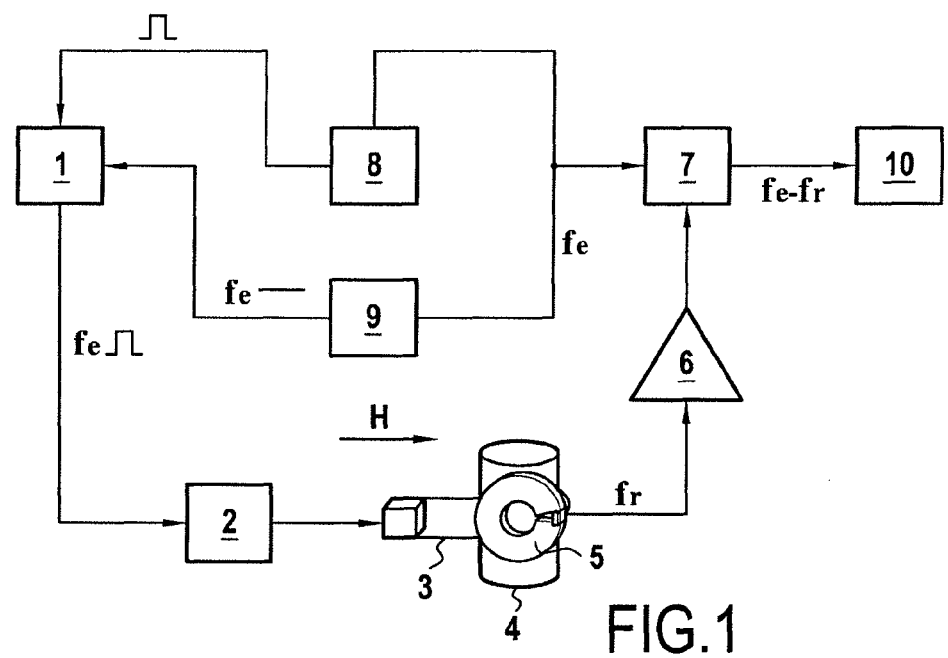
FIG. 1 is a general block diagram showing a first example of an NMR spectrometer of the invention based on hybrid sensors and suited to measurement in weak fields.

The principle of an NMR spectrometer for effecting measurements using a hybrid sensor of the invention is described first with reference to the FIG. 1 embodiment.

An excitation device creates a radio-frequency signal at a predetermined frequency $f_e$ the phase and amplitude of which can be varied.

A frequency synthesizer 9 produces a radio-frequency signal at an emission frequency $f_e$. A sequencer 8 generates pulses that chop the radio-frequency signal produced by the frequency synthesizer 9.

An emission module 1 connected to the frequency synthesizer 9 and to the sequencer 8 produces high-intensity radio-frequency pulses at the predetermined emission frequency $f_e$ via a protection circuit 2 that can consist of diodes connected in anti-parallel to an excitation coil 3 that is generally tuned to the operating frequency to maximize the amplitude of the pulses.

The excitation coil is constructed so that it can contain the sample 4 to be measured, which can be an object or a patient, and is mounted so that it produces a field perpendicular to the static magnetic field H.

The invention uses a superconductive-magnetoresistive hybrid sensor 5 to recover the signal emitted by virtue of the precession of the nuclei of the sample 4 at a resonant frequency $f_r$ very close to the emission frequency $f_e$.

In the FIG. 1 embodiment, which is suited to measurements in a weak magnetic field, i.e. a static field such that the sensor is not saturated, the sensor 5 can be directly in contact with the sample 4.

The hybrid sensor 5 preferably has its sensitive axis perpendicular to the field created by the excitation coil 3 and perpendicular to the static magnetic field H.

The magnetoresistances of the hybrid sensor 5 detect the signal at the frequency $f_r$ and are connected to a low-noise preamplifier 6 that drives a receiver circuit 7 operating in demodulation mode.

The demodulation circuit 7 therefore receives both pulses at the emission frequency $f_e$ from the sequencer 8 and the frequency synthesizer 9 and also pulses received at the resonant frequency $f_r$ from the preamplifier 6.

The sequencer 8 therefore monitors both emission and reception, which functions are fed by a common frequency synthesizer 9.

An acquisition device 10 recovers an output signal at the frequency $f_e-f_r$ or $f_e+f_r$.

Figure 7:
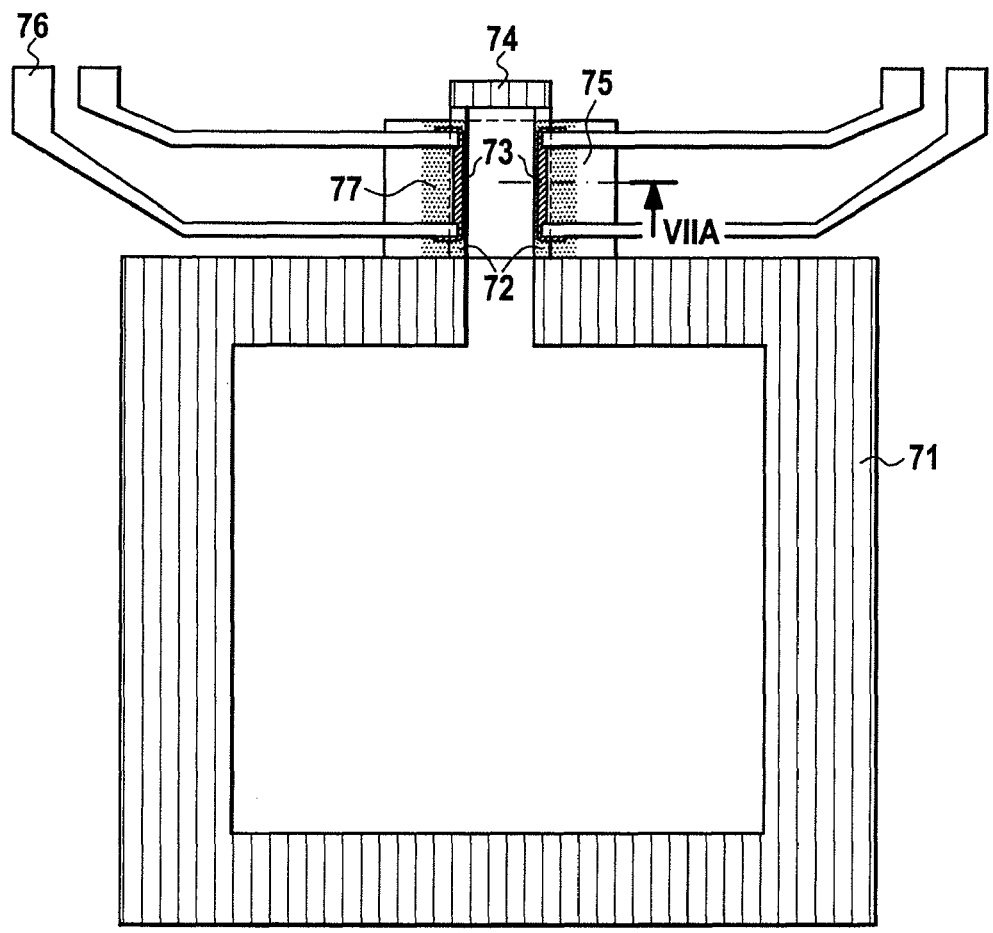
FIG. 7 is a diagram of one example of a hybrid sensor protected by a metal layer that can be used in the invention.
Figure 7A:
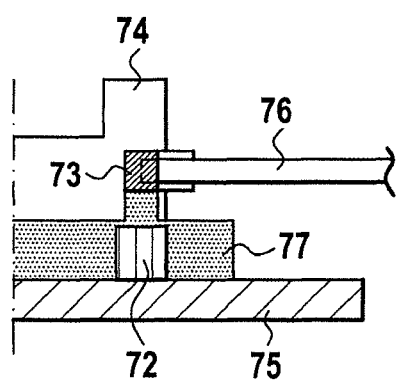
FIG. 7A is a section taken along the line VIIA-VIIA in FIG. 7.

The superconductive-magnetoresistive hybrid sensor 5 includes a superconductive loop 71 having a constriction 72 and a magnetoresistor sensor 73 in the immediate vicinity of the constriction 72 (see FIG. 7).

The constriction 72 reduces the section of the superconductive loop 71 sufficiently to increase the current density significantly.

The general principle of a hybrid sensor is based on a flux/field transformer that consists of a large capture loop 71 associated with one or more constrictions 72 a few micrometers wide. One or more magnetoresistive sensors 73 placed at the constriction(s) can be Hall-effect sensors, anisotropic magnetoresistance (AMR) sensors, giant magnetoresistance (GMR) sensors, tunnel magnetoresistance (TMR) sensors or colossal magnetoresistance (CMR) sensors. The sensors 73 are separated from the superconductive layer 72 by an insulative deposit such as $SiO_2$ or $Si_3N_4$.

The magnetoresistive sensor(s) effect(s) measurements via metal contacts 76, which can be of gold, for example, or of copper protected by tantalum.

When the flux/field transformer is subjected to the RF pulses, currents of several amperes are generated inducing a transition toward the normal state of the constriction followed by violent heating thereof. If the pulses are sufficiently intense, the constriction is destroyed. For example, a 400 watt (W) pulse destroys a constriction 5 micrometer (µm) wide and 100 nanometer (nm) thick.

The hybrid sensor must therefore be designed both to be able to operate at relatively high frequencies and also to be able to withstand the radio-frequency pulses.

The first condition is met by using an insulative sensor support such as sapphire. This achieves a uniform hybrid sensor response up to frequencies of more than 100 megahertz (MHz).

To obtain a hybrid sensor that can withstand the pulses, it is advantageous to design the superconductive loop so that it is wide outside the constriction(s) in order both to optimize the sensitivity of the sensor and also to serve as a heat sink able to evacuate the power of the pulse quickly. An optimization calculation based on calculating the gain of the flux/field transformer and on a finite element calculation of the heat generated by a radio-frequency pulse gives a loop width equal to 0.7 times the loop radius. Loop widths between 0.1 and 0.9 times the loop radius can be used, however. The calculation also shows that a relatively large superconductive area 74 on either side of the constriction 72 also improves the evacuation of heat during a pulse.

For strong pulses (>400 W), additional protection can be created by covering the constriction and the magnetoresistive sensors with a non-superconductive metal layer 75. This additional metal layer must not cover the main loop, just the area of the constrictions. This layer has two functions.

The first function is to serve as a heat sink. A metal is advantageously chosen having a low resistivity and good thermal conductivity, such as copper or aluminum. This metal layer can be in ohmic contact with the superconductor but must not be in electrical contact with the sensors. When the loop is superconducting, the whole of the supercurrent passes through the loop and when the constriction reaches the critical current (at the beginning of the pulse), the current can be evacuated into the adjacent metal layer, which serves as a thermostatic heat sink for the constriction.

The second function is to provide electromagnetic protection. The metal layer 75 is then positioned so that it screens the emission coil. Its thickness must be greater than the skin thickness at the operating frequency.

For a measuring application in a weak field, as in FIG. 1, the size of the superconductive loop 71 of the hybrid sensor 5 must be adapted to the object to be measured.

The superconductor used can be from the family of oxides with a high critical temperature, for example YbaCuO, having a transition temperature above 77 kelvins (K). The sensor 5 is separated from the sample by a non-metal wall and as hard as possible an isolating vacuum. The sensor 5 is connected to a source of coolant, which can be liquid nitrogen. It can be directly immersed in the cryogenic liquid. The excitation coil is disposed perpendicularly to the loop of the sensor, if possible, and perpendicular to the static magnetic field H. This configuration applies in particular to quadripolar nuclear resonance and nuclear magnetic resonance in the terrestrial magnetic field.

The hybrid sensor 5 can be produced in accordance with the teachings of the document WO 2004/068158 A1.

Figure 2:
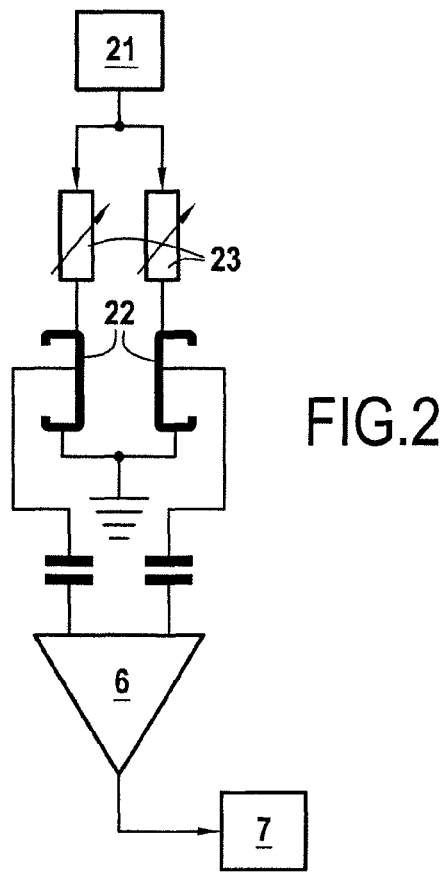
FIG. 2 is a diagram showing one example of electronic circuits connected to a pair of magnetoresistive sensors that can be used in a device of the invention.

More specifically, as shown in FIG. 2, an NMR hybrid sensor can take the form of two sensors 22 configured as a Wheatstone half-bridge. This avoids temperature and overall magnetic field fluctuations and means that there is no output signal in the absence of a precession signal.

The signal at the terminals of the magnetoresistive sensors 22 is a resistance measurement that is advantageously effected at four points. Each sensor is then supplied with power by a current source 21 with balancing resistors 23 and the voltage is measured and amplified by the preamplifier 6. This preamplifier is specifically chosen to have minimum noise for a resistance equal to the resistance of the magnetoresistive sensor(s).

The invention is also used for measurement in relatively strong fields, typically greater than 1 millitesla (mT).

Figure 3:
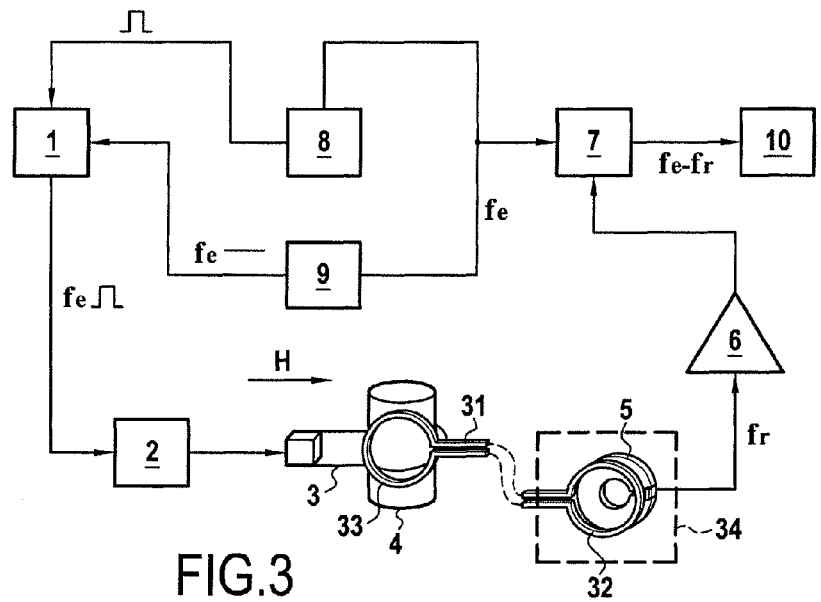
FIG. 3 is a general block diagram showing a second example of an NMR spectrometer of the invention based on hybrid sensors, equipped with a flux/flux transformer and suited to measurement in strong fields.

As shown in FIG. 3, the hybrid sensor 5 is then not in the immediate vicinity of the sample 4, but is instead coupled to the sample via a flux/flux transformer 31 referred to below for simplicity as the flux transformer.

The flux transformer 31 enables the hybrid sensor to be located far away from the static magnetic field H in which measurement is effected and prevents saturation of the magnetoresistive sensor by the static magnetic field.

The flux transformer 31 can take the form of two interconnected loops 32, 33.

The first loop (primary) 32 is superposed on the superconductive loop of the hybrid sensor 5, the combination of these two loops being placed in a cooled enclosure 34.

The second loop (secondary) 33 surrounds the sample 4 or is positioned in its immediate vicinity.

The flux/flux transformer 31 can be superconducting, normal or partially superconducting. The size of the primary 32 must be made equal to the size of the loop 71 of the hybrid sensor 5. The size of the secondary 33 must be such that it can contain the sample 4 to be measured. The turns ratio between the primary 32 and the secondary 33 must be such that the inductances on each side are equal. The critical temperature of a superconductive flux transformer 31 is advantageously close to or greater than that of the hybrid sensor. A superconductive flux/flux transformer 31 has the advantage of being a low-noise device whereas a normal flux/flux transformer suffers from thermal noise associated with its resistance. Moreover, the standard flux/flux transformer is less effective at low frequencies. It is then important to minimize its resistance by using either wires of large diameter or insulated stranded wires, which have the advantage of a lower resistance at high frequencies. The primary 32, which is close to the hybrid sensor, advantageously takes the form of a superconductor, provided that the contact resistances are low.

The sensor 5 is placed in a cooled enclosure to render its loop 71 superconducting.

A high-temperature superconductor is advantageously used, enabling operation at up to 85K or to improve sensitivity at very low temperatures. The cooled chamber 34 containing the sensor is magnetically shielded to limit unwanted noise.

This chamber 34 has the necessary outputs for the flux transformer 31, the power supply current for the magnetoresistive sensors, and the voltage at the terminals of the magnetoresistive sensors. The primary 32 of the flux transformer 31 faces the loop 71 of the hybrid sensor 5. The primary 32 and the capture loop 71 of the hybrid sensor 5 are advantageously the same size. The primary 32 can have a diameter smaller than the inside diameter of the capture loop 71.

The secondary 33 of the flux transformer 31 surrounds the sample 4, preferably in a so-called saddle configuration. It is connected to the primary 32 by a twisted wire in order to prevent additional loops. The flux transformer 31 must be fabricated with relatively large or stranded wire in order to have the lowest possible resistance. The diameter of the secondary 32 is determined by the size of the sample 4 to be measured.

The secondary 33 of the flux transformer 31 is orthogonal to the main magnetic field H. The excitation coil 3 is orthogonal to the main magnetic field H and also orthogonal to the secondary 33 of the flux transformer 31.

The hybrid sensor 5 can also have the configuration already described with reference to FIG. 7. To maximize the signal-to-noise ratio, it is advisable to use magnetoresistive sensors having a relatively high resistance. A resistance of 3 kilohms (kΩ) is the optimum, but this resistance can vary between 100 ohms (Ω) and 20 kΩ without difficulty. Moreover, as indicated above, a half-bridge configuration as shown in FIG. 2 is desirable as it avoids fluctuations in temperature and fluctuations caused by the presence of planar magnetic fields. The example given is that of GMR sensors in a half-bridge configuration. Each sensor is 1 mm long and is supplied with power by current lines. Two voltage lines are used to measure the resistance. The two GMR sensors are constructed so as to respond identically to the presence of an external field. The voltage difference between the two sensors is measured by the preamplifier, which is a differential amplifier, as shown in FIG. 2. The sensors are supplied with power by an AC supply at a frequency given by the equation $f_{cap}=f_e+f_{loc}$ where $f_{loc}$ is the receiver operating frequency. A fairly low frequency can be chosen, for example 77 kilohertz (kHz), enabling the use of operational amplifiers of very low impedance, well suited to a resistance of 3 kΩ.

Figure 9:
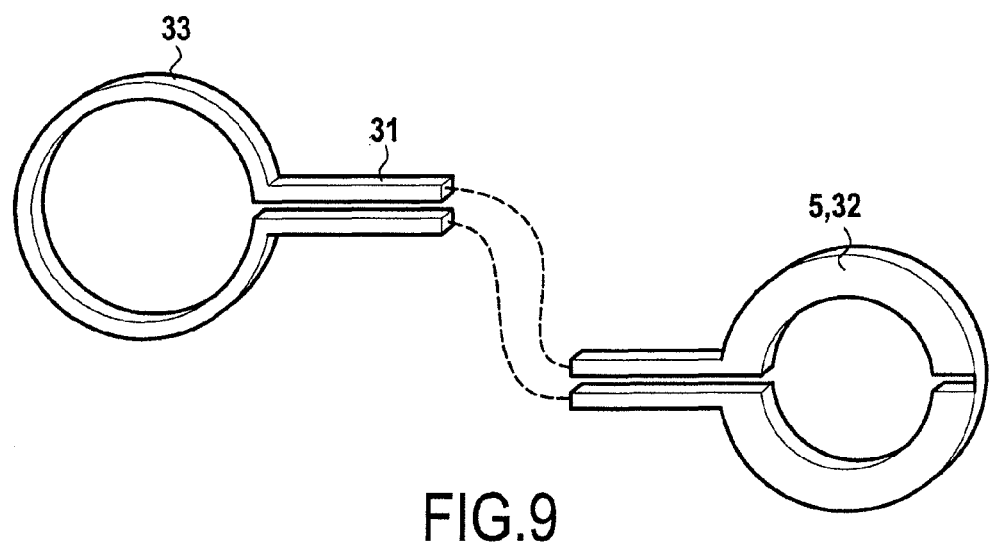
FIG. 9 is a diagram of one particular embodiment of the invention in a configuration in which a flux/flux transformer is combined with a flux/field transformer.

If a flux transformer 31 is used, it is possible to combine the flux/flux transformer 31 and the flux/field transformer of the hybrid sensor 5 in a single object, as shown in FIG. 9. The primary 32 of the flux transformer 31 is then the superconductive loop 71 of the hybrid sensor 5. This solution is advantageous if the size of the hybrid sensor 5 and the size of the sample 4 are comparable.

In FIG. 3, the modules 1 to 3 and 6 to 10 can be entirely identical to the corresponding modules of the FIG. 1 NMR spectrometer bearing the same reference numbers, and so these modules are not described again.

Figure 4:
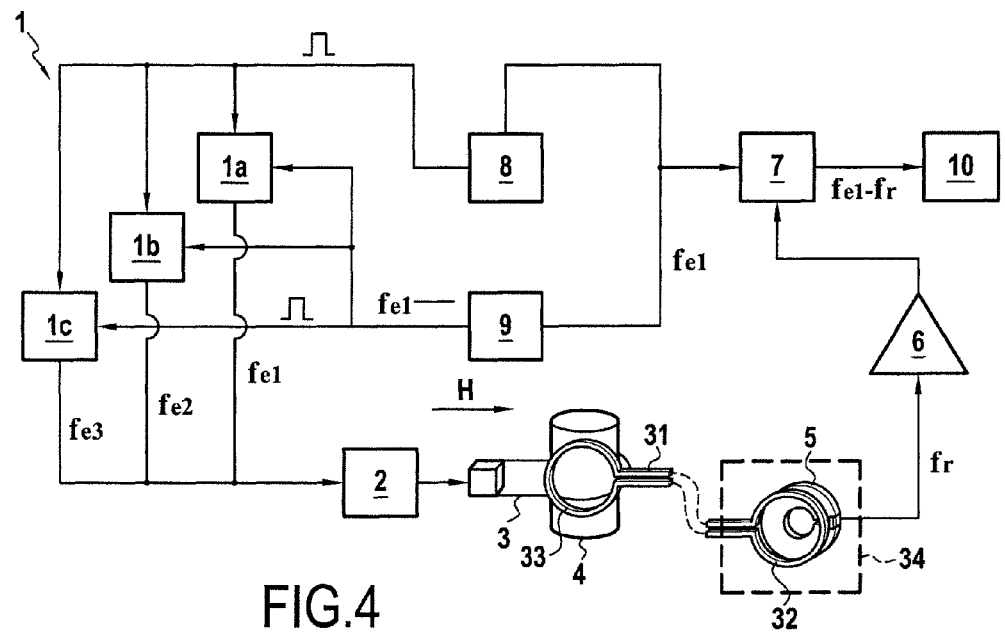
FIG. 4 is a general block diagram showing a different embodiment of an NMR spectrometer using multiple emission frequencies.

FIG. 4 shows another embodiment in which a number of emission frequencies $f_{e1}$, $f_{e2}$, $f_{e3}$ are used. The excitation coil is then designed for multiple tuning.

The excitation device includes sending means with multiple channels 1a, 1b, 1c for sending high-intensity radio-frequency pulses with a plurality of predetermined emission frequencies $f_{e1}$, $f_{e2}$, $f_{e3}$ to the multiple tuning excitation coil 3 so as to be able to tune to any of the predetermined emission frequencies.

A hybrid sensor 5 has the advantage of being a broadband device and the receive function can therefore be identical with only a change of operating frequency.

Figure 8:
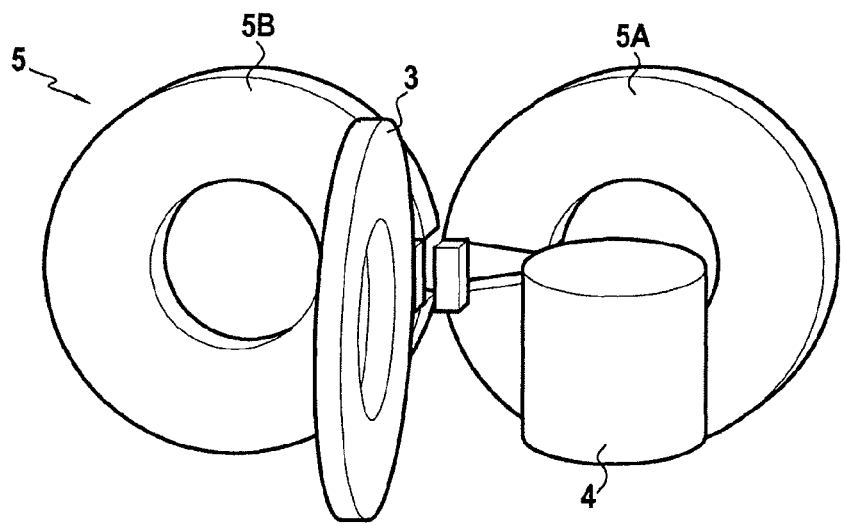
FIG. 8 is a diagram showing one particular embodiment of the invention in a configuration in which the hybrid sensor is configured as a gradiometer and the sample is one of the loops of the gradiometer.

FIG. 8 shows one particular embodiment in which the dual hybrid sensor 5 configured as a gradiometer comprises first and second hybrid sensors 5A, 5B disposed so that their sensitivity axes are symmetrical relative to the excitation coil 3 and perpendicular to the field created thereby. The first hybrid sensor 5A is placed in the immediate vicinity of the sample 4. The gradiometer configuration partly compensates the effects of the pulses provided that the two parts of the gradiometer see the excitation coil in the same way.

Figure 5:
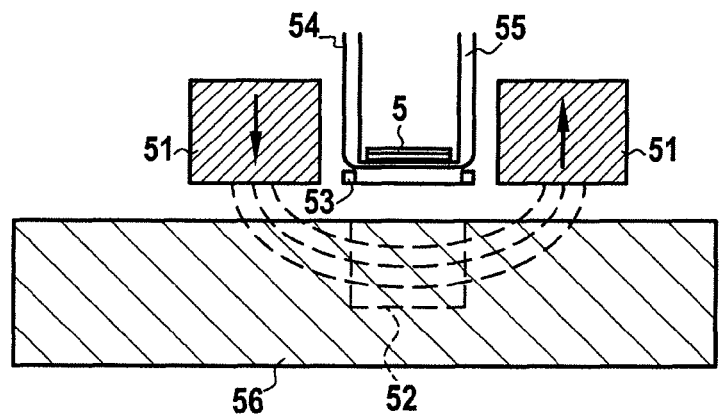
FIG. 5 is a diagram showing another embodiment of the invention suited to surface NMR.

The static magnetic field can be created by a coil or by permanent magnets. One possible use of the hybrid sensors is surface detection, which makes advantageous use of the sensitivity of the sensors. FIG. 5 shows one such system.

Permanent magnets 51 create a known magnetic field in a particular volume 52. A surface excitation coil 53 induces precession in that particular zone. The hybrid sensor 5 reads the precession signal and is separated from the surface 56 and the excitation coil 53 by a wall 54 and an isolating vacuum 55. A cooling system based either on cryogenic liquids or on a cryogenerator system cools the sensor to maintain its temperature below the critical temperature of the superconductor.

Figure 10:
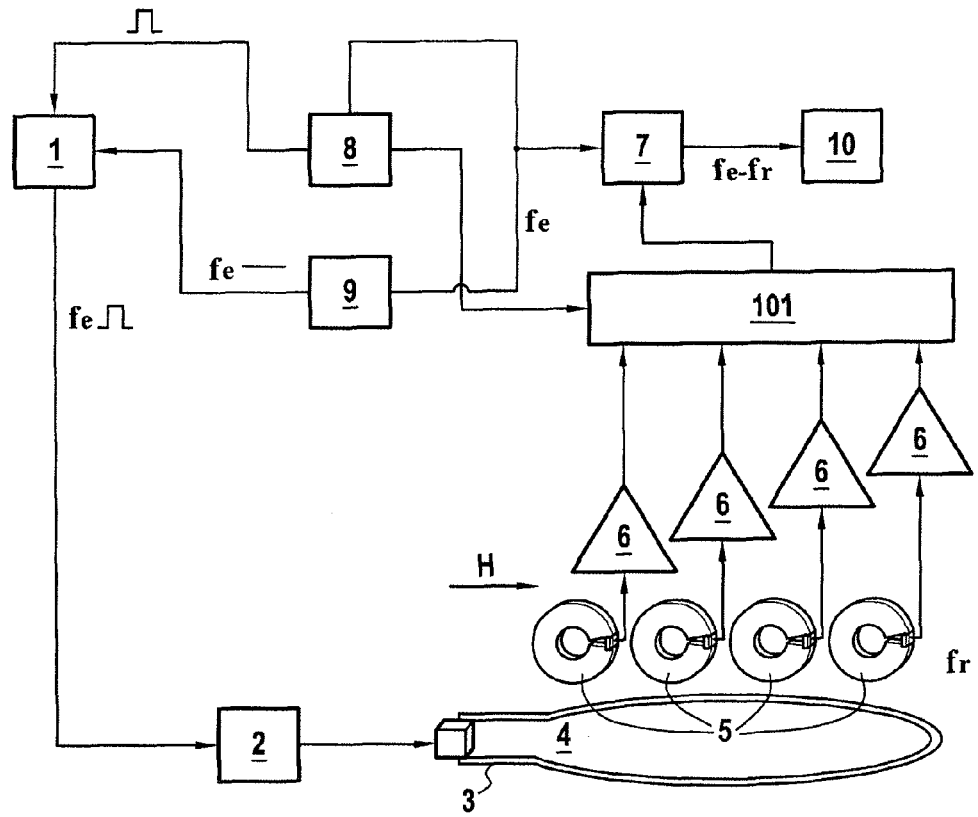
FIG. 10 is a general diagram showing one embodiment of an NMR spectrometer with a set of hybrid sensors.

For resonance imaging, instead of a single hybrid sensor 5, a number of hybrid sensors 5 can be used, each covering a measurement zone. FIG. 10 shows one such configuration.

A single excitation loop 3 of sufficient size can be used with the sensors 5 each having their own preamplifier stage 6. Reception can then be multiplexed by sufficiently fast switching effected by a switch 101 controlled by the sequencer 8.

The magnetic field H is created by permanent magnets 51, as explained with reference to FIG. 5, which magnets are preferably of NdFeB or SmCo rare earth alloy to create a sufficiently strong magnetic field. Fields of the order of 0.05 T can be created in this way. The shape of the magnets and their positions are finely adjusted to obtain a homogeneous static field in the measurement zone that is sufficient given the width of the spectrum lines of the sample to be measured. The operating frequency is then given by the gyromagnetic ratio of the kind of nucleus under observation. The excitation coil is also adjusted to homogenize the radio-frequency field in the working zone. The sensors 5 are parallel to the excitation coil 53 and as close as possible to the surface 56, given that a non-metallic protection wall and a sufficiently hard isolating vacuum are required for the sensor to remain below its critical temperature. In order to minimize the number of sensors whilst retaining sufficient resolution, the size of the sensors is made equal to the distance of the sensor from the measurement zone. Each sensor 5 is supplied with AC power in order to have an output signal of sufficiently low frequency to be able to use low-noise analog multiplexers.

Figure 6:
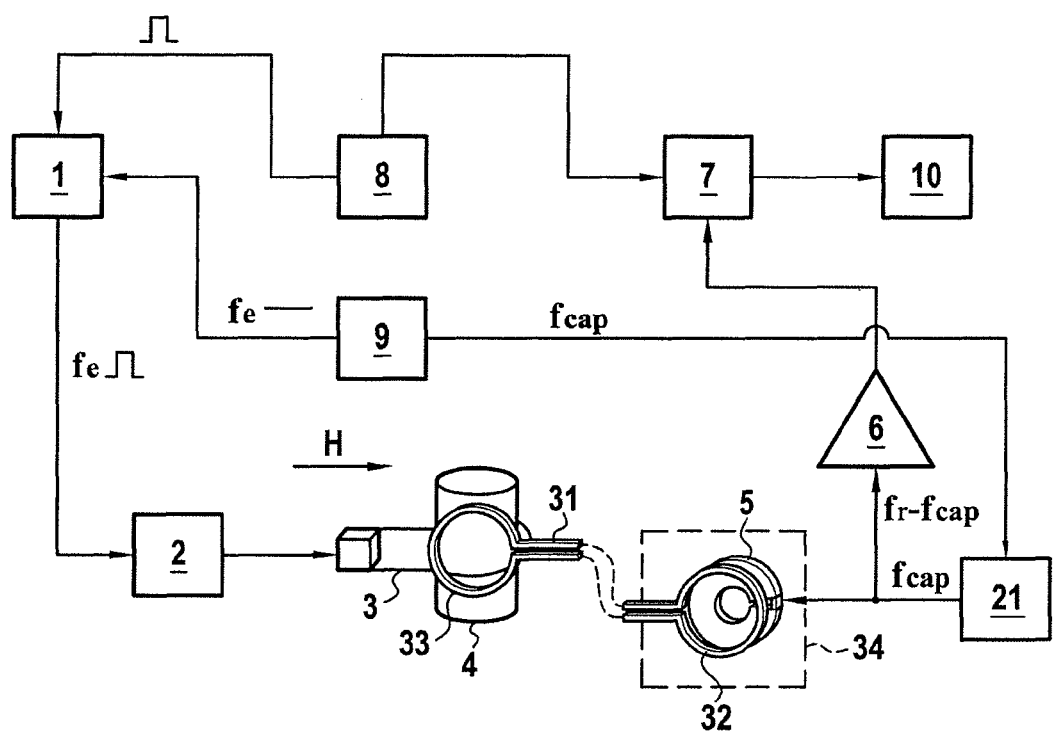
FIG. 6 is a general block diagram showing a different embodiment of an NMR spectrometer with AC power supply magnetoresistive sensors.

FIG. 6 shows how better use can be made of the properties of the hybrid sensors 5 by supplying them with power not by means of a direct current but by means of an alternating current at a frequency of $f_{cap}$ different from the emission frequency $f_e$. This frequency $f_{cap}$ is generated by the frequency synthesizer 9 and sent to the current source 21. The detected and amplified signal is then equal to the sum of or the difference between the resonant frequency $f_r$ and the frequency $f_{cap}$ of the current.

This approach can be particularly advantageous if a current frequency $f_{cap}$ is used such that the difference between the current frequency $f_{cap}$ and the resonant frequency $f_r$ is constant. The receive part of the resonance spectrometer can then be greatly simplified as it always operates at the same frequency.

In the context of medical applications, magnetic resonance in a low magnetic field or the magnetic terrestrial field can be combined with magnetic imaging that measures the magnetic signals emitted by the current flowing in the human body in the range from direct current to alternating current at 1 kHz, such as magneto-encephalography or magneto-cardiography. Magnetic imaging and magnetic resonance can be effected simultaneously with the same set of sensors. Because the response of the hybrid sensors is independent of frequency below a few tens of MHz, the same sensitivity is retained throughout the measurement range.

Figure 11:
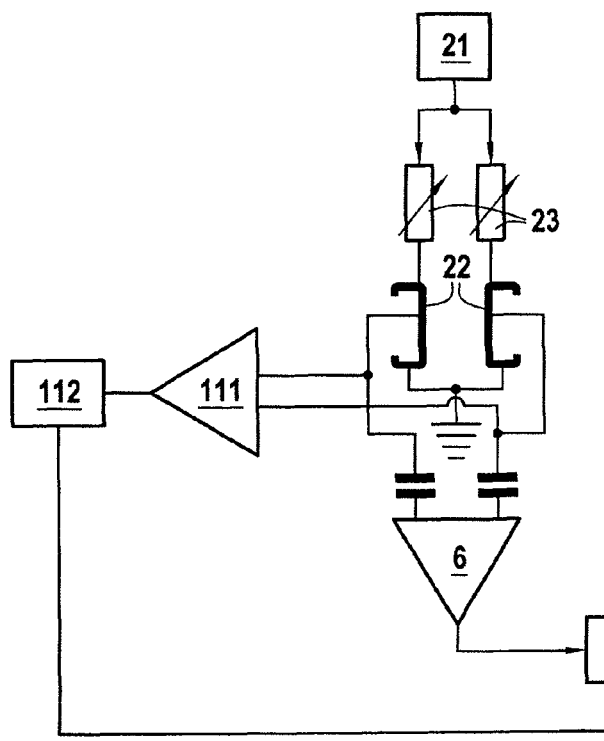
FIG. 11 is a block diagram showing one particular embodiment in an imaging configuration that combines magnetic resonance imaging with low-frequency magnetic imaging.

FIG. 11 shows one such configuration. Each magnetoresistive sensor 22 of the imaging system is connected both to an RF amplifier 6 followed by a demodulator circuit 7 for the magnetic resonance, as shown in FIG. 7, and to a low-frequency preamplifier 111 followed by a filter 112. The magnetoresistive sensors 22 are supplied with power by a DC or AC supply 21. If the supply is a DC supply, the filter 112 is a low-pass filter. If the supply is an AC supply, the filter is a band-pass filter centered on the frequency of the current.

The invention claimed is:

1. A system for measuring a magnetic resonance signal in a sample placed in an external magnetic field, including an excitation device for applying high-intensity radio-frequency pulses at a predetermined emission frequency $f_e$ in a measurement zone containing the sample, the excitation device including an excitation coil tuned to said predetermined emission frequency $f_e$ and disposed in the vicinity of the sample to emit an electromagnetic field essentially perpendicular to the static external magnetic field, the system being characterized in that it further includes at least a one superconductive-magnetoresistive hybrid sensor including a superconductive loop having a constriction adapted to increase significantly the current density and at least a magnetoresistive sensor placed in the immediate vicinity of said constriction, separated therefrom by an insulative deposit, said magnetoresistive sensor and said constriction being covered with a layer of non-superconductive metal to serve as a heat sink and to provide protection against destruction by radio-frequency pulses.

2. A system according to claim 1, characterized in that the superconductive-magnetoresistive hybrid sensor includes at least two magnetoresistive sensors in a Wheatstone half-bridge configuration.

3. A system according to claim 2, characterized in that each pair of hybrid sensors in a Wheatstone half-bridge configuration is also connected to an additional low-frequency preamplifier itself connected to a filter to enable a magnetic field measurement at low frequency to be effected at the same time as a magnetic resonance measurement by the same sensors.

4. A system according to claim 1, characterized in that each magnetoresistive sensor is supplied with power by an AC supply at a predetermined frequency $f_{cap}$ different from said predetermined emission frequency $f_e$.

5. A system according to claim 4, characterized in that the difference between the frequency $f_{cap}$ of the current supplied to the magnetoresistive sensor and the resonant frequency $f_r$ of the sample is constant.

6. A system according to claim 1, characterized in that the hybrid sensor is directly in the vicinity of the sample.

7. A system according to claim 6, characterized in that the sensitivity axis of the hybrid sensor is perpendicular to the field emitted by said excitation coil.

8. A system according to claim 1, characterized in that the hybrid sensor is coupled to the sample by a flux transformer.

9. A system according to claim 8, characterized in that the flux transformer is at least partially superconductive.

10. A system according to claim 8, characterized in that the flux transformer includes a secondary loop that surrounds the sample or is disposed in the immediate vicinity of the sample.

11. A system according to claim 8, characterized in that the flux transformer includes a secondary loop perpendicular to the excitation coil.

12. A system according to claim 8, characterized in that the flux transformer includes a primary loop parallel to the superconductive loop of the hybrid sensor and has a size equivalent thereto.

13. A system according to claim 9, characterized in that the flux transformer includes a primary loop parallel to the superconductive loop of the hybrid sensor and has a size equivalent thereto.

14. A system according to claim 8, characterized in that the flux transformer includes a primary loop that consists of the superconductive loop of the hybrid sensor.

15. A system according to claim 1, characterized in that it includes a dual hybrid sensor configured as a gradiometer including first and second hybrid sensors with their sensitivity axes symmetrical relative to the excitation coil and perpendicular to the field created thereby, one of the first and second hybrid sensors being in the immediate vicinity of the sample.

16. A system according to claim 1, characterized in that the excitation device includes multichannel emission means for emitting high-intensity radio-frequency pulses at predetermined emission frequencies $f_{e1}$, $f_{e2}$, $f_{e3}$ toward the excitation coil that is of the multiple tuning type so that it can be tuned to any of said predetermined emission frequencies $f_{e1}$, $f_{e2}$, $f_{e3}$.

17. A system according to claim 1, characterized in that the magnetoresistive sensor is essentially perpendicular to the static external magnetic field.

18. A system according to claim 1, characterized in that the sample is a surface facing permanent magnets for creating said static magnetic field in a particular volume, the excitation coil is parallel to said surface in the vicinity of said particular volume, and the hybrid sensor is in the vicinity of said excitation coil and parallel thereto, being separated therefrom by a wall and an insulative empty space.

19. A system according to claim 1, characterized in that said excitation device includes a frequency synthesizer for emitting a radio-frequency signal at an emission frequency $f_e$, a sequencer for emitting pulses for chopping the radio-frequency signal, an emission module connected to the frequency synthesizer and to the sequencer to emit said high-intensity radio-frequency pulses at said predetermined emission frequency $f_e$, a protection circuit for applying said pulses to the excitation coil, a preamplifier for receiving the signal at the resonant frequency $f_r$ very close to the emission frequency $f_e$ captured by the hybrid sensor, a demodulator circuit for receiving both the pulses at the emission frequency $f_e$ from the sequencer and the frequency synthesizer and also the pulses received at the resonant frequency $f_r$ from the preamplifier, and an acquisition device for recovering an output signal at the frequency $f_e$-$f_r$.

20. A system according to claim 1, characterized in that it includes a plurality of hybrid sensors.

21. A system according to claim 20, characterized in that it includes a single excitation coil and each hybrid sensor cooperates with an individual preamplifier.

22. A system according to claim 1, characterized in that each hybrid sensor is further connected to an additional low-frequency preamplifier itself connected to a filter to enable a magnetic field measurement at low frequency to be effected at the same time as a magnetic resonance measurement by the same sensors.

23. A system according to claim 3, characterized in that the magnetoresistive sensors of the hybrid sensors are supplied with power by a direct current supply and the filter is a low-pass filter.

24. A system according to claim 3, characterized in that the magnetoresistive sensors of the hybrid sensors are supplied with power by an alternating current supply and the filter is a band-pass filter centered on the frequency of said alternating current.

25. A system according to claim 1, characterized in that the magnetoresistive sensors of the hybrid sensors are chosen from Hall-effect sensors, anisotropic magnetoresistance sensors, giant magnetoresistance sensors, tunnel magnetoresistance sensors, and colossal magnetoresistance sensors.

26. A method of measuring a magnetic resonance signal in a sample placed in a static external magnetic field, wherein high-intensity radio-frequency pulses are applied at a predetermined emission frequency $f_e$ in a measurement zone containing the sample to an excitation coil tuned to said predetermined emission frequency $f_e$ and disposed in the vicinity of the sample so as to emit an electromagnetic field essentially perpendicular to the static external magnetic field, the method being characterized in that a magnetic resonance signal is detected by a superconductive magnetoresistive hybrid sensor including a superconductive loop including a constriction and a magnetoresistive sensor in the immediate vicinity of said constriction and separated therefrom by an insulative layer, said magnetoresistive sensor and said constriction being covered by at least one layer of non-superconductive metal in order to serve as a heat sink and to provide protection against destruction by radio-frequency pulses.

27. A system according to claim 13, characterized in that said primary loop and said superconductive loop of the hybrid sensor are placed in a cooled enclosure.

* * * * *